US 11,372,058 B2

(12) United States Patent
Kato

(10) Patent No.: US 11,372,058 B2
(45) Date of Patent: Jun. 28, 2022

(54) IMPEDANCE MATCHING DEVICE, ABNORMALITY DIAGNOSIS METHOD, AND STORAGE MEDIUM FOR ABNORMALITY DIAGNOSIS PROGRAM

(71) Applicant: TOKYO ELECTRON LIMITED, Tokyo (JP)

(72) Inventor: Hideo Kato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 149 days.

(21) Appl. No.: 16/837,560

(22) Filed: Apr. 1, 2020

(65) Prior Publication Data
US 2020/0319263 A1 Oct. 8, 2020

(30) Foreign Application Priority Data
Apr. 8, 2019 (JP) .............................. JP2019-073257

(51) Int. Cl.
*G01R 31/64* (2020.01)
*H03H 7/40* (2006.01)
*H03H 1/00* (2006.01)

(52) U.S. Cl.
CPC .............. *G01R 31/64* (2020.01); *H03H 7/40* (2013.01)

(58) Field of Classification Search
CPC ...... H03H 1/00; H03H 2210/00; H01L 21/00; H01L 2221/00
See application file for complete search history.

(56) References Cited

U.S. PATENT DOCUMENTS

| 2003/0097984 | A1* | 5/2003 | Nakano | ............. | H01J 37/32183 |
| | | | | | 118/712 |
| 2004/0050327 | A1* | 3/2004 | Johnson | ............ | H01J 37/32082 |
| | | | | | 118/640 |
| 2004/0244688 | A1* | 12/2004 | Himori | ............. | H01L 21/31138 |
| | | | | | 257/E21.252 |
| 2009/0255800 | A1* | 10/2009 | Koshimizu | ....... | H01J 37/32165 |
| | | | | | 204/164 |
| 2011/0214811 | A1* | 9/2011 | Ashida | ..................... | H03H 7/40 |
| | | | | | 333/33 |

(Continued)

FOREIGN PATENT DOCUMENTS

JP 2007-295447 A 11/2007

*Primary Examiner* — Jermele M Hollington
*Assistant Examiner* — Temilade S Rhodes-Vivour
(74) *Attorney, Agent, or Firm* — Weihrouch IP

(57) ABSTRACT

An impedance matching device includes: a variable capacitor connected between a radio-frequency power supply and a load; a first detector that detects an index value that determines impedance matching between the radio-frequency power supply and the load, and a first state value that indicates a state of a radio-frequency power; a second detector that detects a second state value that indicates a state of radio-frequency power output to the load; an adjustment unit that adjusts a capacitance value of the variable capacitor such that the index value detected by the first detector falls within a target range; and a diagnosis unit configured to diagnose an abnormality of the variable capacitor, the first detector, or the second detector based on the capacitance value adjusted by the adjustment unit, the first state value detected by the first detector, and the second state value detected by the second detector.

3 Claims, 7 Drawing Sheets

(56) References Cited

U.S. PATENT DOCUMENTS

2014/0354173 A1* 12/2014 Matsuno .................. H03H 7/40
    315/287
2015/0371876 A1* 12/2015 Terauchi ........... H01J 37/32082
    438/710

* cited by examiner

IMPEDANCE MATCHING DEVICE, ABNORMALITY DIAGNOSIS METHOD, AND STORAGE MEDIUM FOR ABNORMALITY DIAGNOSIS PROGRAM

CROSS-REFERENCE TO RELATED APPLICATION

This application is based on and claims priority from Japanese Patent Application No. 2019-073257 filed on Apr. 8, 2019 with the Japan Patent Office, the disclosure of which is incorporated herein in its entirety by reference.

TECHNICAL FIELD

The present disclosure relates to an impedance matching device, an abnormality diagnosis method, and an abnormality diagnosis program.

BACKGROUND

In the related art, there has been known a plasma processing apparatus that performs a plasma process on a workpiece (e.g., a wafer) using plasma. Such a plasma processing apparatus includes, for example, a stage that holds the workpiece and also functions as an electrode, in a processing container that may form a vacuum space. The plasma processing apparatus performs a plasma process on the workpiece placed on the stage while applying a predetermined radio-frequency power to the stage from a radio-frequency power supply. An impedance matching device that performs an impedance matching between the radio-frequency power supply and the processing container may be disposed between the radio-frequency power supply and the processing container serving as a load. The impedance matching device includes, for example, a variable capacitor connected between a radio-frequency power supply and a load, and performs an impedance matching by adjusting the capacitance value of the variable capacitor. Reference is made to Japanese Patent Laid-Open Publication No. 2007-295447.

SUMMARY

An impedance matching device of the present embodiment includes: a variable capacitor connected between a radio-frequency power supply and a load; a first detector configured to detect an index value that determines an impedance matching between the radio-frequency power supply and the load, and a first state value that indicates a state of a radio-frequency power input from the radio-frequency power supply; a second detector configured to detect a second state value that indicates a state of a radio-frequency power output to the load; an adjustment unit configured to adjust a capacitance value of the variable capacitor in a stepwise manner such that the index value detected by the first detector falls within a target range indicating completion of the impedance matching; and a diagnosis unit configured to diagnose an abnormality of the variable capacitor, the first detector, or the second detector based on the capacitance value adjusted by the adjustment unit, the first state value detected by the first detector, and the second state value detected by the second detector.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, various embodiments will be described in detail with reference to the drawings. In addition, in the respective drawings, the same or corresponding parts will be denoted by the same symbols.

In the related art, there has been known a plasma processing apparatus that performs a plasma process on a workpiece (e.g., a wafer) using plasma. Such a plasma processing apparatus includes, for example, a stage that holds the workpiece and also functions as an electrode, in a processing container that may form a vacuum space. The plasma processing apparatus performs a plasma process on the workpiece placed on the stage while applying a predetermined radio-frequency power to the stage from a radio-frequency power supply. An impedance matching device that performs an impedance matching between the radio-frequency power supply and the processing container may be disposed between the radio-frequency power supply and the processing container serving as a load. The impedance matching device includes, for example, a variable capacitor connected between a radio-frequency power supply and a load, and performs an impedance matching by adjusting the capacitance value of the variable capacitor.

In the impedance matching device, no consideration is given to the self-diagnosis of the abnormality of each component such as the variable capacitor. For this reason, self-diagnosis of abnormalities of each component constituting the impedance matching device is expected.

First Embodiment

Figure 1:
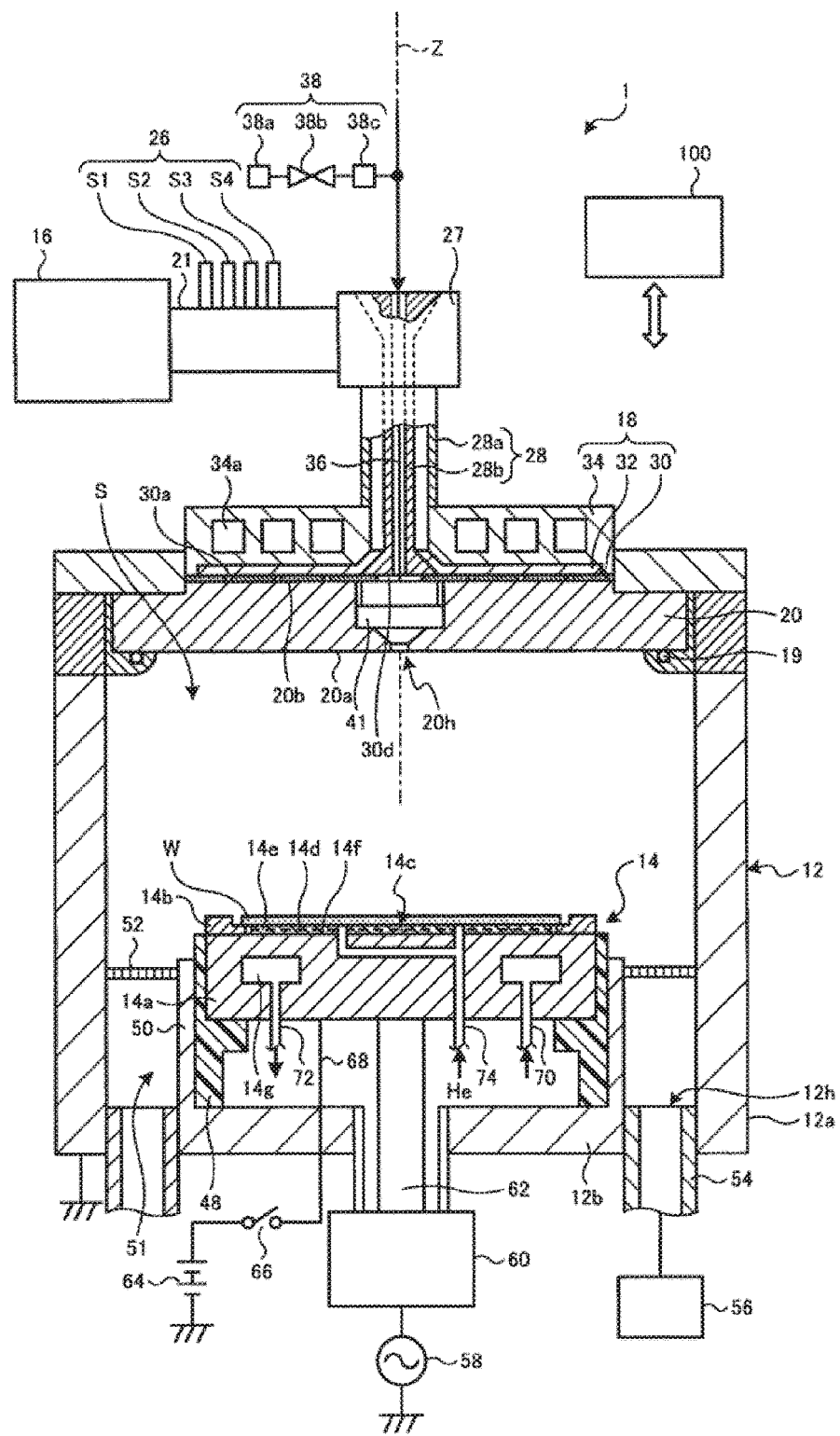
FIG. 1 is a schematic cross-sectional view illustrating the configuration of a plasma processing apparatus according to a first embodiment.

Configuration of Plasma Processing Apparatus Related to Underlying Technology FIG. 1 is a view illustrating a plasma processing apparatus 1 related to the underlying technology. The plasma processing apparatus 1 illustrated in FIG. 1 includes a chamber (processing container) 12 and a microwave output device 16. The plasma processing apparatus 1 is configured as a microwave plasma processing apparatus that excites a gas with microwaves. The plasma processing apparatus 1 has a stage 14, an antenna 18, and a dielectric window 20.

The chamber 12 provides a processing space S therein. The chamber 12 has a side wall 12a and a bottom 12b. The side wall 12a is formed in a substantially cylindrical shape. The central axis of the side wall 12a substantially coincides with an axis Z extending in the vertical direction. The bottom 12b is provided at a lower end of the sidewall 12a. The bottom 12b is provided with an exhaust hole 12h for exhaust. Further, an upper end portion of the sidewall 12a is opened.

A dielectric window 20 is provided on the upper end portion of the side wall 12a. The dielectric window 20 has a lower surface 20a facing the processing space S. The dielectric window 20 closes the opening at the upper end portion of the side wall 12a. An O-ring 19 is interposed between the dielectric window 20 and the upper end portion of the side wall 12a. The O-ring 19 makes the sealing of the chamber 12 more reliable.

A stage 14 is accommodated in the processing space S. The stage 14 is provided to face the dielectric window 20 in the vertical direction. Further, the stage 14 is provided to sandwich the processing space S between the dielectric window 20 and the stage 14. The stage 14 is configured to support a wafer W which is a workpiece placed thereon.

The stage 14 includes a base 14a and an electrostatic chuck 14c. The base 14a has a substantially disk shape and is made of a conductive material such as aluminum. The central axis of the base 14a substantially coincides with the axis Z. The base 14a is supported by a cylindrical support 48. The cylindrical support 48 is formed of an insulating material and extends vertically upward from the bottom 12b. A conductive cylindrical support 50 is provided on the outer periphery of the cylindrical support 48. The cylindrical support 50 extends vertically upward from the bottom 12b of the chamber 12 along the outer periphery of the cylindrical support 48. An annular exhaust path 51 is formed between the cylindrical support 50 and the side wall 12a.

A baffle plate 52 is provided above the exhaust path 51. The baffle plate 52 has a ring shape. The baffle plate 52 has a plurality of through holes that penetrates the baffle plate 52 in the plate thickness direction. The above-described exhaust hole 12h is provided below the baffle plate 52. An exhaust device 56 is connected to the exhaust hole 12h via an exhaust pipe 54. The exhaust device 56 includes an automatic pressure control (APC) valve and a vacuum pump such as a turbo molecular pump. The processing space S may be decompressed to a desired vacuum degree by the exhaust device 56.

The base 14a also serves as a radio-frequency electrode. A radio-frequency power supply 58 for RF bias is electrically connected to the base 14a via a power supply rod 62 and a matching unit 60. The radio-frequency power supply 58 outputs a fixed frequency suitable for controlling the energy of ions to be drawn into the wafer W, for example, a radio-frequency of 13.65 MHz (hereinafter, appropriately referred to as a "radio-frequency for bias") at a set power. The matching unit 60 is an impedance matching device that performs impedance matching between the radio-frequency power supply 58 and a load such as an electrode, plasma, or the chamber 12.

An electrostatic chuck 14c is provided on the upper surface of the base 14a. The electrostatic chuck 14c holds the wafer W with an electrostatic attraction force. The electrostatic chuck 14c includes an electrode 14d, an insulating film 14e, and an insulating film 14f, and has a substantially disk shape. The central axis of the electrostatic chuck 14c substantially coincides with the axis Z. The electrode 14d of the electrostatic chuck 14c is made of a conductive film and is provided between the insulating films 14e and 14f. A DC power supply 64 is electrically connected to the electrode 14d via a switch 66 and a covered wire 68. The electrostatic chuck 14c may attract and hold the wafer W by a Coulomb force generated by a DC voltage applied from the DC power supply 64. Further, a focus ring 14b is provided on the base 14a. The focus ring 14b is disposed to surround the wafer W and the electrostatic chuck 14c.

A coolant chamber 14g is provided inside the base 14a. The coolant chamber 14g is formed to extend, for example, around the axis Z. The coolant from a chiller unit is supplied to the coolant chamber 14g via a pipe 70. The coolant supplied to the coolant chamber 14g is returned to the chiller unit through a pipe 72. By controlling the temperature of the coolant by the chiller unit, the temperature of the electrostatic chuck 14c and, consequently, the temperature of the wafer W is controlled.

Further, a gas supply line 74 is provided in the stage 14. The gas supply line 74 is provided to supply a heat transfer gas, for example, He gas, between the upper surface of the electrostatic chuck 14c and the back surface of the wafer W.

The microwave output device 16 generates a microwave having a power according to the set power. The microwave output device 16 outputs, for example, a single-frequency (i.e., a single peak (SP)) microwave that excites the processing gas supplied into the chamber 12. The microwave output device 16 is configured to variably adjust the frequency and power of the microwave. In an example, the microwave output device 16 may adjust the power of the microwave within a range of 0 W to 5000 W and may adjust the frequency of the microwave within a range of 2400 MHz to 2500 MHz.

The plasma processing apparatus 1 further includes a waveguide 21, a tuner 26, a mode converter 27, and a coaxial waveguide 28. The waveguide 21 and the coaxial waveguide 28 are waveguides that guide the microwave generated by the microwave output device 16 to the antenna 18 of the chamber 12 (to be described later). An output unit of the microwave output device 16 is connected to one end of the waveguide 21. The other end of the waveguide 21 is connected to the mode converter 27. The waveguide 21 is, for example, a rectangular waveguide. The tuner 26 is provided in the waveguide 21. The tuner 26 has movable short-circuit plates S1 to S4. Each of the movable short-circuit plates S1 to S4 is configured such that the amount of protrusion of the movable short-circuit plate with respect to the internal space of the waveguide 21 may be adjusted. The tuner 26 matches the impedance of the microwave output device 16 with the load, for example, the impedance of the chamber 12, by adjusting the protruding position of each of the movable short-circuit plates S1 to S4 with respect to a predetermined reference position.

The mode converter 27 converts the mode of the microwave from the waveguide 21 and supplies the microwave after the mode conversion to the coaxial waveguide 28. The coaxial waveguide 28 includes an outer conductor 28a and an inner conductor 28b. The outer conductor 28a has a substantially cylindrical shape, and the central axis thereof substantially coincides with the axis Z. The inner conductor 28b has a substantially cylindrical shape and extends inside the outer conductor 28a. The central axis of the inner conductor 28b substantially coincides with the axis Z. The coaxial waveguide 28 transmits the microwave from the mode converter 27 to the antenna 18.

The antenna 18 is provided on a surface 20b opposite to the lower surface 20a of the dielectric window 20. The antenna 18 includes a slot plate 30, a dielectric plate 32, and a cooling jacket.

The slot plate 30 is provided on the surface 20b of the dielectric window 20. The slot plate 30 is formed of a conductive metal and has a substantially disk shape. The central axis of the slot plate 30 substantially coincides with the axis Z. A plurality of slot holes 30a is formed in the slot plate 30. In an example, the plurality of slot holes 30a constitute a plurality of slot pairs. Each of the plurality of slot pairs includes two substantially elongated slot holes 30a which extend in directions intersecting with each other. The plurality of slot pairs are arranged along one or more concentric circles around the axis Z. Further, a through hole 30d through which a conduit 36 (to be described later) may pass is formed in the center of the slot plate 30.

The dielectric plate 32 is provided on the slot plate 30. The dielectric plate 32 is formed of a dielectric material such as quartz and has a substantially disk shape. The central axis of the dielectric plate 32 substantially coincides with the axis Z. A cooling jacket 34 is provided on the dielectric plate 32. The dielectric plate 32 is provided between the cooling jacket 34 and the slot plate 30.

The surface of the cooling jacket 34 has conductivity. A flow path 34a is formed inside the cooling jacket 34. A coolant is configured to be supplied to the flow path 34a. A lower end of the outer conductor 28a is electrically connected to the upper surface of the cooling jacket 34. Further, a lower end of the inner conductor 28b is electrically connected to the slot plate 30 through a hole formed in the cooling jacket 34 and the center of the dielectric plate 32.

The microwave from the coaxial waveguide 28 propagates through the dielectric plate 32 and is supplied to the dielectric window 20 through a plurality of slot holes 30a of the slot plate 30. The microwave supplied to the dielectric window 20 is introduced into the processing space S.

A conduit 36 passes through the inner hole of the inner conductor 28b of the coaxial waveguide 28. Further, as described above, the through hole 30d through which the conduit 36 may pass is formed in the center of the slot plate 30. The conduit 36 extends through the inner hole of the inner conductor 28b and is connected to a gas supply system 38.

The gas supply system 38 supplies a processing gas for processing the wafer W to the conduit 36. The gas supply system 38 may include a gas source 38a, a valve 38b, and a flow rate controller 38c. The gas source 38a is a gas source of the processing gas. The valve 38b switches the supply of the processing gas from the gas source 38a and the stop of the supply. The flow rate controller 38c is, for example, a mass flow controller, and adjusts a flow rate of the processing gas from the gas source 38a.

The plasma processing apparatus 1 may further include an injector 41. The injector 41 supplies the gas from the conduit 36 to a through hole 20h formed in the dielectric window 20. The gas supplied to the through hole 20h of the dielectric window 20 is supplied to the processing space S. Then, the processing gas is excited by the microwave introduced into the processing space S from the dielectric window 20. Thus, plasma is generated in the processing space S, and the wafer W is processed by active species such as ions and/or radicals from the plasma.

The plasma processing apparatus 1 further includes a controller 100. The controller 100 controls each part of the plasma processing apparatus 1. The controller 100 may include a processor such as a CPU, a user interface, and a storage unit.

The processor integrally controls the respective parts of the microwave output device 16, the stage 14, the gas supply system 38, and the exhaust device 56 by executing a program and a process recipe stored in the storage unit. Further, the processor stores various measured values in the storage unit.

The user interface includes a keyboard or a touch panel on which a process manager performs, for example, a command input operation for managing the plasma processing apparatus 1, and a display for visualizing and displaying the operation status of the plasma processing apparatus 1.

The storage unit stores, for example, a control program (software) that implements various processes executed by the plasma processing apparatus 1 under the control of the processor, and a process recipe including processing condition data. The processor calls and executes various control programs from the storage unit as necessary, such as instructions from a user interface. A desired process is executed in the plasma processing apparatus 1 under the control of such a processor. Further, the storage unit may store the monitoring results corresponding to the executed process recipes (process conditions) in association with each other. The monitoring results include, for example, the above-described tuner position and a measured value measured by the microwave output device 16 (to be described later).

Configuration of Impedance Matching Device

Figure 2:
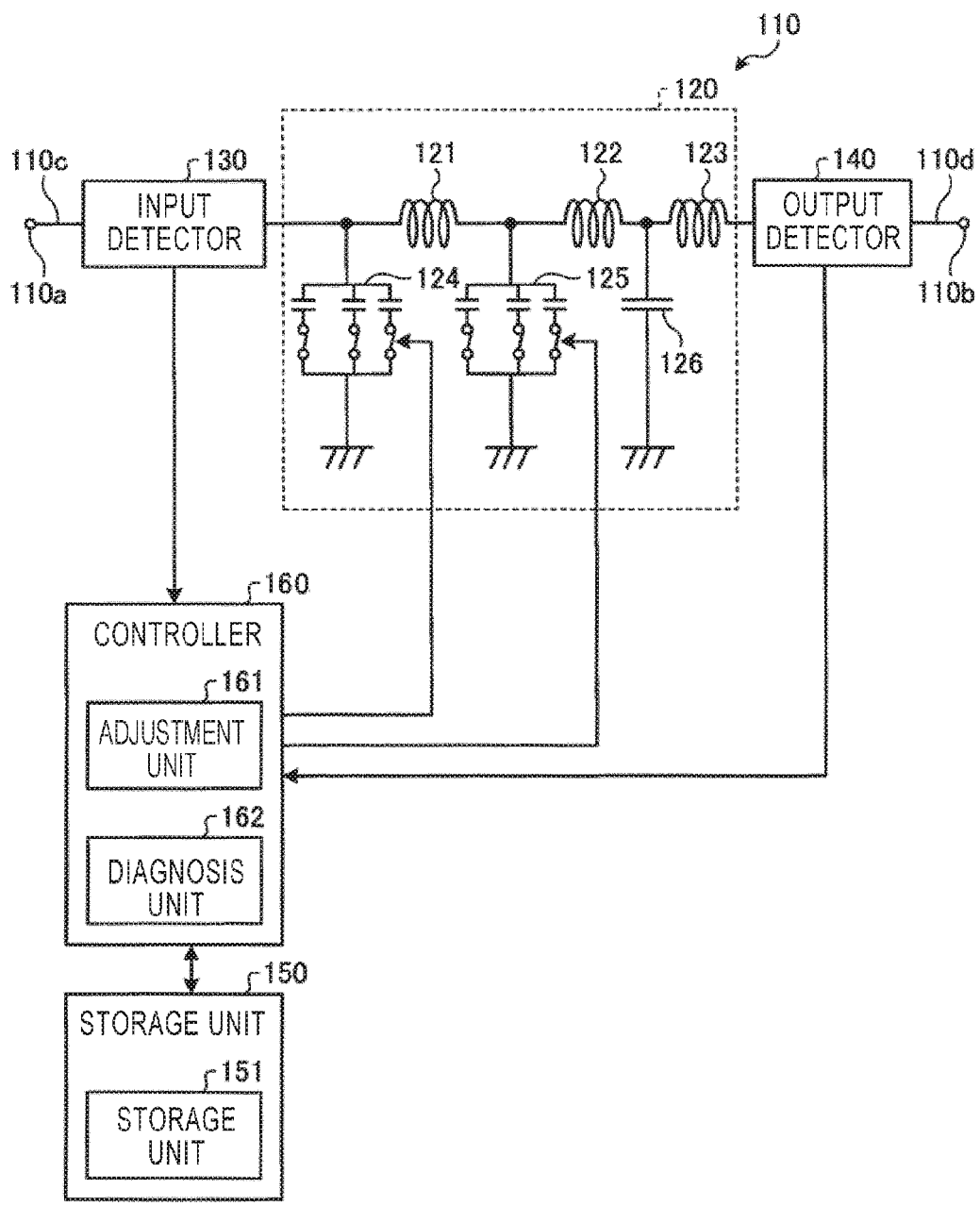
FIG. 2 is a view illustrating an example of the configuration of an impedance matching device according to the first embodiment.

Hereinafter, the configuration of the impedance matching device 110 according to a first embodiment will be described. FIG. 2 is a view illustrating an example of the configuration of the impedance matching device 110 according to the first embodiment. The structure of the impedance matching device 110 illustrated in FIG. 1 may be applied to, for example, the matching unit 60 included in the plasma processing device 1 of the underlying technology illustrated in FIG. 1. The impedance matching device 110 illustrated in FIG. 1 has an input terminal 110a connected to a radio-frequency power supply and an output terminal 110b connected to a load. The radio-frequency power supply is, for example, the radio-frequency power supply 58 illustrated in FIG. 1, and the load is, for example, the chamber 12 illustrated in FIG. 1. The input terminal 110a is a terminal to which a radio-frequency is input from a radio-frequency power supply, and the output terminal 110b is a terminal that outputs a radio-frequency to a load. Hereinafter, the radio-frequency input from the radio-frequency power supply to the input terminal 110a is appropriately referred to as an "input radio-frequency," and the radio-frequency output from the output terminal 110b to the load is appropriately referred to as an "output radio-frequency."

In addition, the impedance matching device 110 includes an impedance matching unit 120 located between the input terminal 110a and the output terminal 110b, an input detector 130, an output detector 140, a storage unit 150, and a controller 160. Also, the storage unit 150 and the controller 160 may be provided outside the impedance matching device 110.

The impedance matching unit 120 is connected to the input terminal 110a via a wiring 110c and is connected to the output terminal 110b via a wiring 110d. The impedance matching unit 120 includes a coil 121, a coil 122, and a coil 123 which are connected in series to the wiring 110c and the wiring 110d. Further, the impedance matching unit 120 has a variable capacitor 124, a variable capacitor 125, and a capacitor 126 which are connected between the radio-frequency power supply and the load (i.e., between the input terminal 110a and the output terminal 110b). The variable capacitor 124 and the variable capacitor 125 are connected in parallel between the input terminal 110a and the output terminal 110b and have variable capacitance values. The capacitance values of the variable capacitors 124 and 125 are adjusted by an adjustment unit 161 of the controller 160 (to be described later). The capacitor 126 is connected in parallel between the input terminal 110a and the output terminal 110b and has a fixed capacitance value. Further, the number of variable capacitors connected between the radio-frequency power supply and the load is not limited to two, but may be one, or may be three or more. Each of the variable capacitors 124 and 125 is an example of a variable capacitor, and a coil may be used instead of a capacitor. Further, various configurations such as a π type and an inverted L type may be applied to the configuration of the impedance matching unit 120.

The input detector 130 is disposed on the wiring 110c, and detects an "index value" that determines impedance matching between the radio-frequency power supply and the load, and a "first state value" indicating a state of a radio-frequency input to the input terminal 110a from the radio-frequency power supply (i.e., an input radio-frequency). Specifically, the input detector 130 detects a phase difference between a voltage and a current of the input radio-frequency as the index value, and detects a power value of the input radio-frequency as the first state value. The input detector 130 is an example of a first detector. Further, as the index value, not only the phase difference between the power and the current of the input radio-frequency but also the input traveling wave power value and the input reflected wave power value may be used.

The output detector 140 is disposed on the wiring 110d and detects a "second state value" indicating a state of a radio-frequency output from the output terminal 110b to the load (i.e., an output radio-frequency). Specifically, the output detector 140 detects the power value of the output radio-frequency as the second state value. The output detector 140 is an example of a second detector.

The storage unit 150 is an arbitrary storage device such as a hard disk, an optical disk, or a semiconductor memory device. The controller 160 is, for example, a processor such as a central processing unit (CPU) or a micro processing unit (MPU).

The storage unit 150 stores programs and various data for executing various processes executed by the impedance matching device 110 under the control of the controller 160. For example, the storage unit 150 stores loss information 151.

The loss information 151 indicates a relationship between the capacitance values of the variable capacitors 124 and 125 and the loss of the entire impedance matching unit 120. The loss information 151 is, for example, information of a table in which the loss is associated with the capacitance values of the variable capacitors 124 and 125. Further, the loss information 151 may be information of a formula for calculating a loss from the capacitance values of the variable capacitors 124 and 125.

The controller 160 functions as various processing units by reading and executing a program stored in the storage unit 150. For example, the controller 160 includes an adjustment unit 161 and a diagnosis unit 162.

The adjustment unit 161 adjusts the capacitance values of the variable capacitors 124 and 125 in a stepwise manner so that the phase difference detected by the input detector 130 falls within a target range indicating completion of impedance matching. Specifically, the adjustment unit 161 repeatedly adjusts the capacitance values of the variable capacitors 124 and 125 by an adjustment amount according to the phase difference until the phase difference detected by the input detector 130 falls within the target range. Then, when the phase difference detected by the input detector 130 falls within the target range, the adjustment unit 161 determines that impedance matching has been completed and ends adjusting the capacitance values of the variable capacitors 124 and 125. In addition, when the input traveling wave power value and the input reflected wave power value fall within the target ranges, the adjustment unit 161 may also determine that the impedance matching has been completed.

The diagnosis unit 162 diagnoses an abnormality of the variable capacitors 124 and 125, the input detector 130, or the output detector 140 based on the capacitance value adjusted by the adjustment unit 161, the power value detected by the input detector 130, and the power value detected by the output detector 140. Hereinafter, the variable capacitors 124 and 125, the input detector 130, or the output detector 140 are appropriately described as "variable capacitors 124 and 125 and the like."

Here, an example of the abnormality diagnosis by the diagnosis unit 162 will be described. First, the diagnosis unit 162 calculates a theoretical value of the power value of the output radio-frequency based on the capacitance value adjusted by the adjustment unit 161 and the power value detected by the input detector 130. For example, the diagnosis unit 162 acquires a loss corresponding to the capacitance value adjusted by the adjustment unit 161 using the loss information 151. Then, the diagnosis unit 162 subtracts the acquired loss from the power value detected by the input detector 130 to calculate a theoretical value of the power value of the output radio-frequency. The theoretical value $P_{out}$ of the power value of the output radio-frequency calculated by the diagnosis unit 162 is expressed by Equation (1).

$$P_{out} = P_{in} - P_{loss}(C1, C2) \qquad (1)$$

In Equation (1), the symbol "$P_{in}$" refers to the power value of the input radio-frequency, and the symbol "$P_{loss}(C1, C2)$" refers to the loss corresponding to the capacitance values C1 and C2 of the variable capacitors 124 and 125.

Then, when a difference between the calculated theoretical value of the power value and the power value detected by the output detector 140 is equal to or greater than a predetermined threshold, the diagnosis unit 162 determines that an abnormality has occurred in the variable capacitors 124 and 125.

As a result, the impedance matching device 110 may determine the occurrence of an abnormality using a difference between the actually detected power value of the output radio-frequency and the theoretical value of the power value of the output radio-frequency and perform a self-diagnosis of an abnormality of each component constituting the impedance matching device 110.

Processing Operation of Impedance Matching Device

Figure 3:
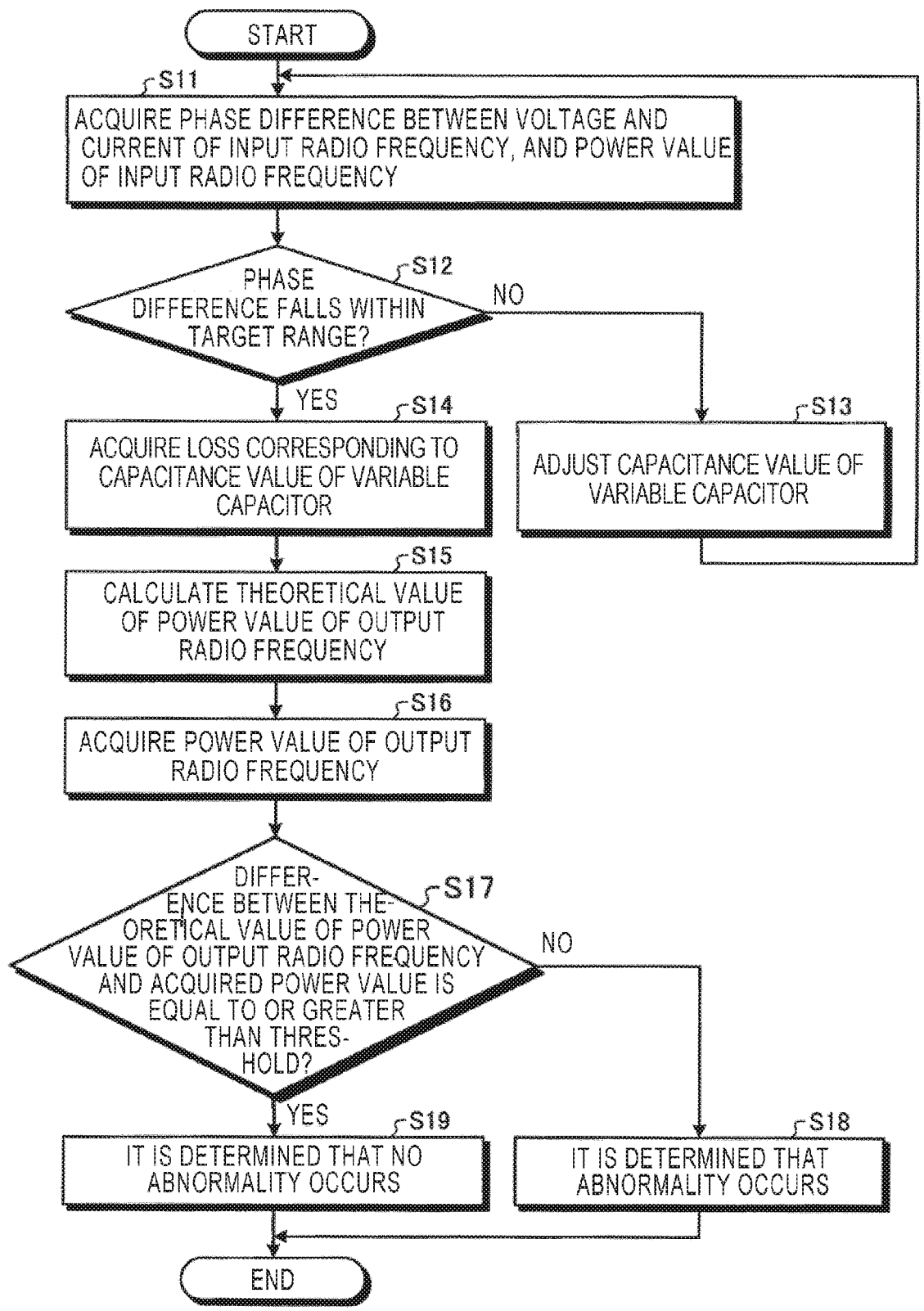
FIG. 3 is a flowchart illustrating an example of a processing operation of the impedance matching device according to the first embodiment.

Next, the configuration of the impedance matching device 110 according to the first embodiment will be described. FIG. 3 is a flowchart illustrating an example of a processing operation of the impedance matching device 110 according to the first embodiment. When the impedance matching device 110 is applied to the matching unit 60 included in the plasma processing apparatus 1 of the underlying technology illustrated in FIG. 1, the processing operation illustrated in FIG. 3 is executed at a timing when, for example, a plasma processing on the wafer W is started in the plasma processing apparatus 1.

As illustrated in FIG. 3, the adjustment unit 161 acquires the phase difference between the voltage and the current of the input radio-frequency and the power value of the input radio-frequency, which are detected by the input detector 130 (step S11).

The adjustment unit 161 determines whether the acquired phase difference falls within a target range indicating a completion of the impedance matching (step S12). When it is determined that the acquired phase difference does not fall within the target range ("No" in step S12), the adjustment unit 161 adjusts the capacitance values of the variable capacitors 124 and 125 by an adjustment amount corresponding to the phase difference (step S13) and returns the process to step S11. Thus, the capacitance values of the variable capacitors 124 and 125 are repeatedly adjusted until the phase difference falls within the target range.

When it is determined that the acquired phase difference falls within the target range ("Yes" in step S12), the adjustment unit 161 ends adjusting the capacitance values of the variable capacitors 124 and 125 and advances the process to step S14.

The diagnosis unit 162 acquires loss corresponding to the capacitance values of the variable capacitors 124 and 125 adjusted by the adjustment unit 161 using the loss information 151 (step S14). Then, the diagnosis unit 162 calculates a theoretical value of the power value of the output radio-frequency by subtracting the acquired loss from the power value of the input radio-frequency acquired in step S11 (step S15).

The diagnosis unit 162 acquires the power value of the output radio-frequency detected by the output detector 140 (step S16).

The diagnosis unit 162 determines whether a difference between the theoretical value of the power value of the output radio-frequency calculated in step S15 and the power value of the output radio-frequency acquired in step S16 is equal to or greater than a predetermined threshold (step S17). When it is determined that the difference between the calculated theoretical value of the power value of the output radio-frequency and the obtained power value of the output radio-frequency is less than the predetermined threshold ("No" in step S17), the diagnosis unit 162 determines that no abnormality has occurred in the variable capacitors 124 and 125 (step S18). When it is determined that the difference between the calculated theoretical value of the power value of the output radio-frequency and the obtained power value of the output radio-frequency is equal to or greater than the predetermined threshold ("Yes" in step S17), the diagnosis unit 162 determines that an abnormality has occurred in the variable capacitors 124 and 125 (step S19).

After diagnosing the abnormality of the variable capacitors 124 and 125, the diagnosis unit 162 may output a diagnosis result indicating whether the abnormality of the variable capacitors 124 and 125 has occurred to a predetermined output unit. The diagnosis unit 162 may also perform an alert when it is determined that an abnormality has occurred in the variable capacitors 124 and 125. Any method may be used for the alert when the alert may be reported to an administrator of the impedance matching device 110. Further, when it is determined that an abnormality has occurred in the variable capacitors 124 and 125, the diagnosis unit 162 may stop the radio-frequency power supply and cut off the input radio-frequency.

As described above, the impedance matching device 110 according to the first embodiment includes the variable capacitors 124 and 125, the input detector 130, the output detector 140, the adjustment unit 161, and the diagnosis unit 162. The variable capacitors 124 and 125 are connected between a radio-frequency power supply (e.g., the radio-frequency power supply 58) and a load (e.g., the chamber 12). The input detector 130 detects an index value that determines impedance matching between the radio-frequency power supply and the load, and a first state value indicating a state of a radio-frequency input from the radio-frequency power supply. The output detector 140 detects a second state value indicating a state of a radio-frequency output to the load. The adjustment unit 161 adjusts the capacitance values of the variable capacitors 124 and 125 in a stepwise manner so that the detected index value falls within a target range indicating completion of impedance matching. The diagnosis unit 162 diagnoses an abnormality of the variable capacitors 124 and 125, the input detector 130, or the output detector 140 based on the adjusted capacitance valued, the detected first state value, and the detected second state value. Thus, the impedance matching device 110 may perform a self-diagnosis of an abnormality of each of the components that constitute the impedance matching device 110 (e.g., the variable capacitors 124 and 125, the input detector 130, or the output detector 140).

Further, in the impedance matching device 110 according to the first embodiment, the input detector 130 detects a phase difference between a voltage and a current of the radio-frequency input from the radio-frequency power supply as an index value, and detects the power value of the radio-frequency input from the radio-frequency power supply as a first state value. The output detector 140 detects the power value of the radio-frequency output to the load as a second state value. The adjustment unit 161 adjusts the capacitance values of the variable capacitors 124 and 125 in a stepwise manner so that the phase difference detected by the input detector 130 falls within the target range. The diagnosis unit 162 calculates a theoretical value of the power value of the radio-frequency output to the load based on the adjusted capacitance values and the power value detected by the input detector 130. The diagnosis unit 162 determines that an abnormality has occurred when a difference between the calculated theoretical value of the power value and the power value detected by the output detector 140 is equal to or greater than a predetermined threshold. Thus, the impedance matching device 110 may determine the occurrence of an abnormality with high accuracy by using a difference between the actually detected power value of the output radio-frequency and the theoretical value of the power value of the output radio-frequency.

Second Embodiment

Next, a second embodiment will be described.

Configuration of Impedance Matching Device

Figure 4:
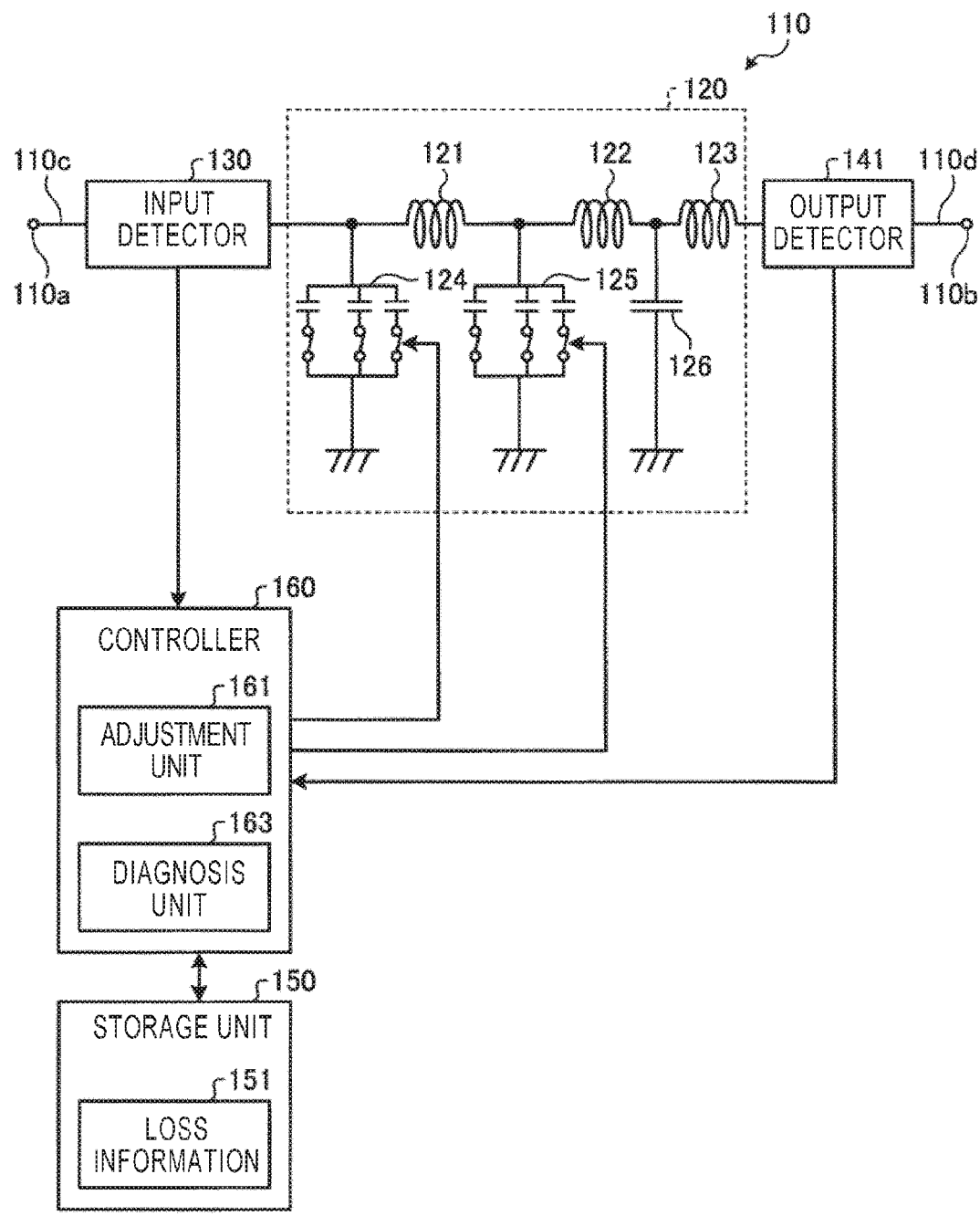
FIG. 4 is a view illustrating an example of the configuration of an impedance matching device according to a second embodiment.

FIG. 4 is a view illustrating an example of the configuration of the impedance matching device 110 according to the second embodiment. The impedance matching device 110 according to the second embodiment has substantially the same configuration as the impedance matching device 110 according to the first embodiment illustrated in FIG. 2. Thus, the same portions are denoted by the same reference numerals, descriptions thereof will be omitted, and different portions will be mainly described. The structure of the impedance matching device 110 illustrated in FIG. 4 may be applied to, for example, the matching unit 60 included in the plasma processing device 1 of the underlying technology illustrated in FIG. 1.

The impedance matching device 110 illustrated in FIG. 4 includes an output detector 141 and a diagnosis unit 163 instead of the output detector 140 and the diagnosis unit 162 illustrated in FIG. 2.

The output detector 141 detects, as the second state value, a $V_{pp}$ value of the radio-frequency output from the output terminal 110b to the load (i.e., the output radio-frequency), and the impedance value on the load side. The $V_{pp}$ value is an amplitude value of a radio-frequency voltage.

The diagnosis unit 163 diagnoses an abnormality of the capacitors 124 and 125 based on the capacitance values adjusted by the adjustment unit 161, the power value detected by the input detector 130, and the $V_{pp}$ value and the impedance value on the load side detected by the output detector 141.

Here, an example of the abnormality diagnosis by the diagnosis unit 163 will be described. First, the diagnosis unit 163 calculates a theoretical value of the $V_{pp}$ value based on the capacitance values adjusted by the adjustment unit 161, the power value detected by the input detector 130, and the impedance value on the load side detected by the output detector 141. For example, the diagnosis unit 163 acquires loss corresponding to the capacitances value adjusted by the adjustment unit 161 using the loss information 151. Then, the diagnosis unit 163 subtracts the obtained loss from the power value detected by the input detector 130 to calculate a theoretical value of the power value of the output radio-frequency. A theoretical value $P_{out}$ of the power value of the output radio-frequency calculated by the diagnosis unit 163 is expressed by Equation (1). Then, the diagnosis unit 163 calculates a theoretical value of the $V_{pp}$ value as represented in Equation (2) based on the calculated theoretical value of the power value of the output radio-frequency and the impedance value on the load side detected by the output detector 141.

$$V_{PP} = \sqrt{\frac{8 P_{out}(R^2 + X^2)}{R}} \quad (2)$$

In Equation (2), the symbol "$V_{pp}$" refers to the theoretical value of the $V_{pp}$ value, the symbol "$P_{out}$" refers to the theoretical value of the power value of the output radio-frequency, the symbol "R" refers to a real part of the impedance value on the load side, and the symbol "X" refers to an imaginary part of the impedance value on the load side.

Then, when a difference between the calculated theoretical value of the $V_{pp}$ value and the $V_{pp}$ value detected by the output detector 141 is equal to or greater than a predetermined threshold, the diagnosis unit 163 determines that an abnormality has occurred in the variable capacitors 124 and 125.

As a result, the impedance matching device 110 may determine the occurrence of an abnormality by using the difference between the actually detected $V_{pp}$ value and the theoretical value of the $V_{pp}$ value, and perform a self-diagnosis of the abnormality of each component constituting the impedance matching device 110.

Processing Operation of Impedance Matching Device

Figure 5:
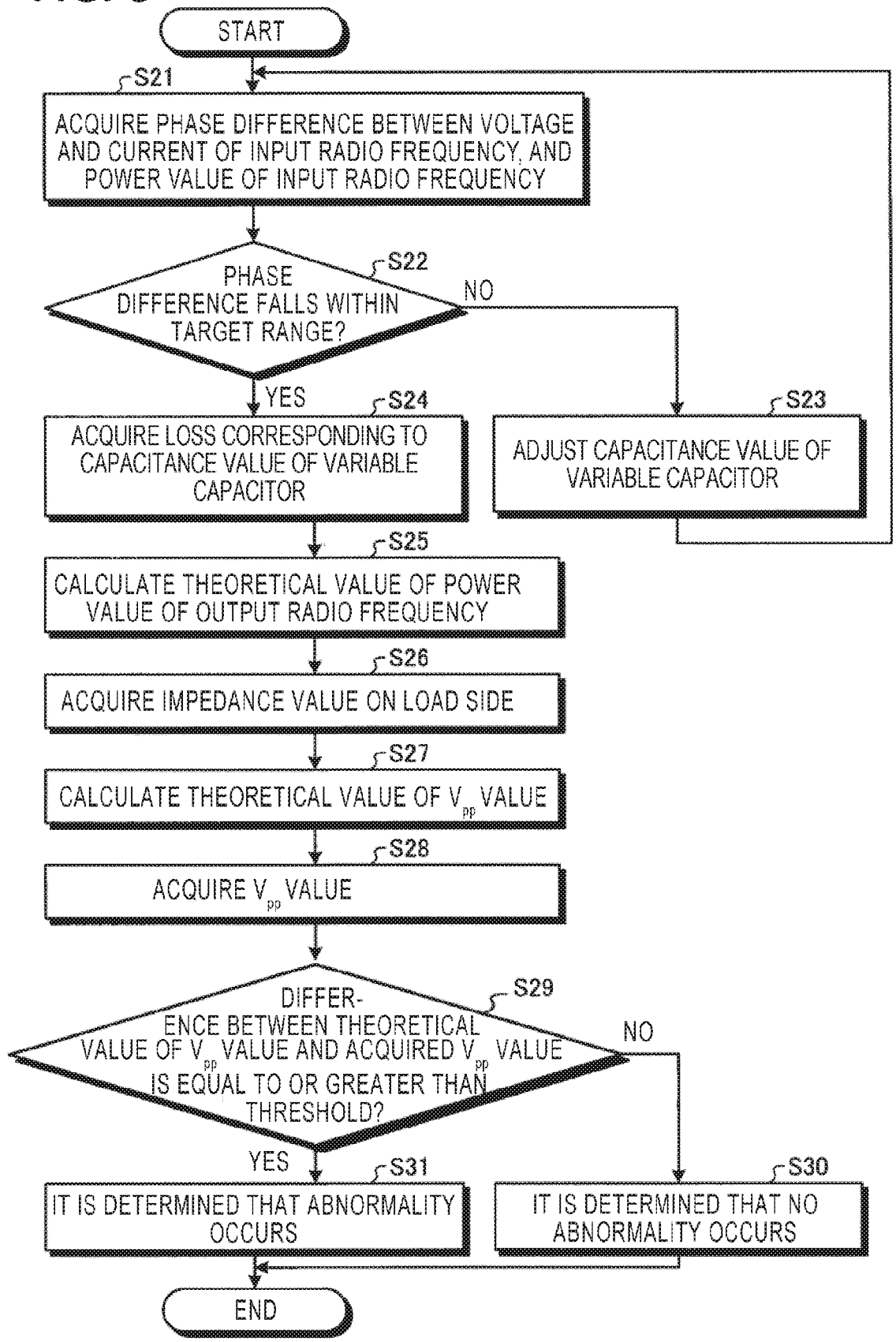
FIG. 5 is a flowchart illustrating an example of a processing operation of the impedance matching device according to the second embodiment.

Next, the configuration of the impedance matching device 110 according to the second embodiment will be described. FIG. 5 is a flowchart illustrating an example of a processing operation of the impedance matching device 110 according to the second embodiment. When the impedance matching device 110 is applied to the matching unit 60 included in the plasma processing device 1 of the underlying technology illustrated in FIG. 1, the processing operation illustrated in FIG. 5 is executed, for example, at a timing when the plasma processing on the wafer W is started in the plasma processing apparatus 1.

As illustrated in FIG. 5, the adjustment unit 161 acquires the phase difference between the voltage and the current of the input radio-frequency and the power value of the input radio-frequency, which are detected by the input detector 130 (step S21).

The adjustment unit 161 determines whether the acquired phase difference falls within a target range indicating the completion of the impedance matching (step S22). When it is determined that the acquired phase difference does not fall within the target range ("No" in step S22), the adjustment unit 161 adjusts the capacitance values of the variable capacitors 124 and 125 by an adjustment amount corresponding to the phase difference (step S23) and returns the process to step S21. Thus, the capacitance values of the variable capacitors 124 and 125 are repeatedly adjusted until the phase difference falls within the target range.

When it is determined that the acquired phase difference falls within the target range ("Yes" in step S22), the adjustment unit 161 ends adjusting the capacitance values of the variable capacitors 124 and 125, and advances the process to step S24.

The diagnosis unit 163 acquires the loss corresponding to the capacitance values of the variable capacitors 124 and 125 adjusted by the adjustment unit 161 using the loss information 151 (step S24). Then, the diagnosis unit 163 calculates a theoretical value of the power value of the output radio-frequency by subtracting the acquired loss from the power value of the input radio-frequency acquired in step S21 (step S25).

The diagnosis unit 163 acquires an impedance value on the load side detected by the output detector 141 (step S26). Then, the diagnosis unit 163 calculates a theoretical value of the $V_{pp}$ value based on the theoretical value of the power value of the output radio-frequency calculated in step S25 and the impedance value on the load side acquired in step S26 (step S27).

The diagnosis unit 163 acquires the $V_{pp}$ value detected by the output detector 141 (step S28).

The diagnosis unit 163 determines whether a difference between the theoretical value of the $V_{pp}$ value calculated in step S27 and the $V_{pp}$ value acquired in step S28 is equal to or greater than a predetermined threshold (step S29). When it is determined that the difference between the calculated theoretical value of the $V_{pp}$ value and the acquired $V_{pp}$ value is less than the predetermined threshold ("No" in step S29), the diagnosis unit 163 determines that no abnormality has occurred in the variable capacitors 124 and 125 (step S30). When it is determined that the difference between the calculated theoretical value of the $V_{pp}$ value and the acquired $V_{pp}$ value is equal to or greater than the predetermined threshold ("Yes" in step S29), the diagnosis unit 163 determines that an abnormality has occurred in the variable capacitors 124 and 125 (step S31).

After diagnosing the abnormality of the variable capacitors 124 and 125, the diagnosis unit 163 may output a diagnosis result indicating whether the abnormality of the variable capacitors 124 and 125 has occurred to a predetermined output unit. The diagnosis unit 163 may also perform an alert when it is determined that an abnormality has occurred in the variable capacitors 124 and 125. Any method may be used for the alert when the alert may be reported to an administrator of the impedance matching device 110. Further, when it is determined that an abnormality has occurred in the variable capacitors 124 and 125, the diagnosis unit 163 may stop the radio-frequency power supply and cut off the input radio-frequency.

In the impedance matching device 110 according to the second embodiment, the input detector 130 detects a phase difference between a voltage and a current of the radio-frequency input from the radio-frequency power supply as an index value, and detects the power value of the radio-frequency input from the radio-frequency power supply as a first state value. The output detector 141 detects the $V_{pp}$ value of the radio-frequency output to the load and the impedance value on the load side as a second state value. The adjustment unit 161 adjusts the capacitance values of the variable capacitors 124 and 125 in a stepwise manner so that the phase difference detected by the input detector 130 falls within the target range. The diagnosis unit 163 calculates a theoretical value of the $V_{pp}$ value based on the adjusted capacitance values, the power value detected by the input detector 130, and the impedance value on the load side detected by the output detector 141. When a difference between the calculated theoretical value of the $V_{pp}$ value and the $V_{pp}$ value detected by the output detector 141 is equal to or greater than a predetermined threshold, the diagnosis unit 163 determines that an abnormality has occurred. Thus, the impedance matching device 110 may determine the occurrence of an abnormality with high accuracy using the difference between the actually detected $V_{pp}$ value and the theoretical value of the $V_{pp}$ value.

Third Embodiment

Next, a third embodiment will be described.

Configuration of Impedance Matching Device

Figure 6:
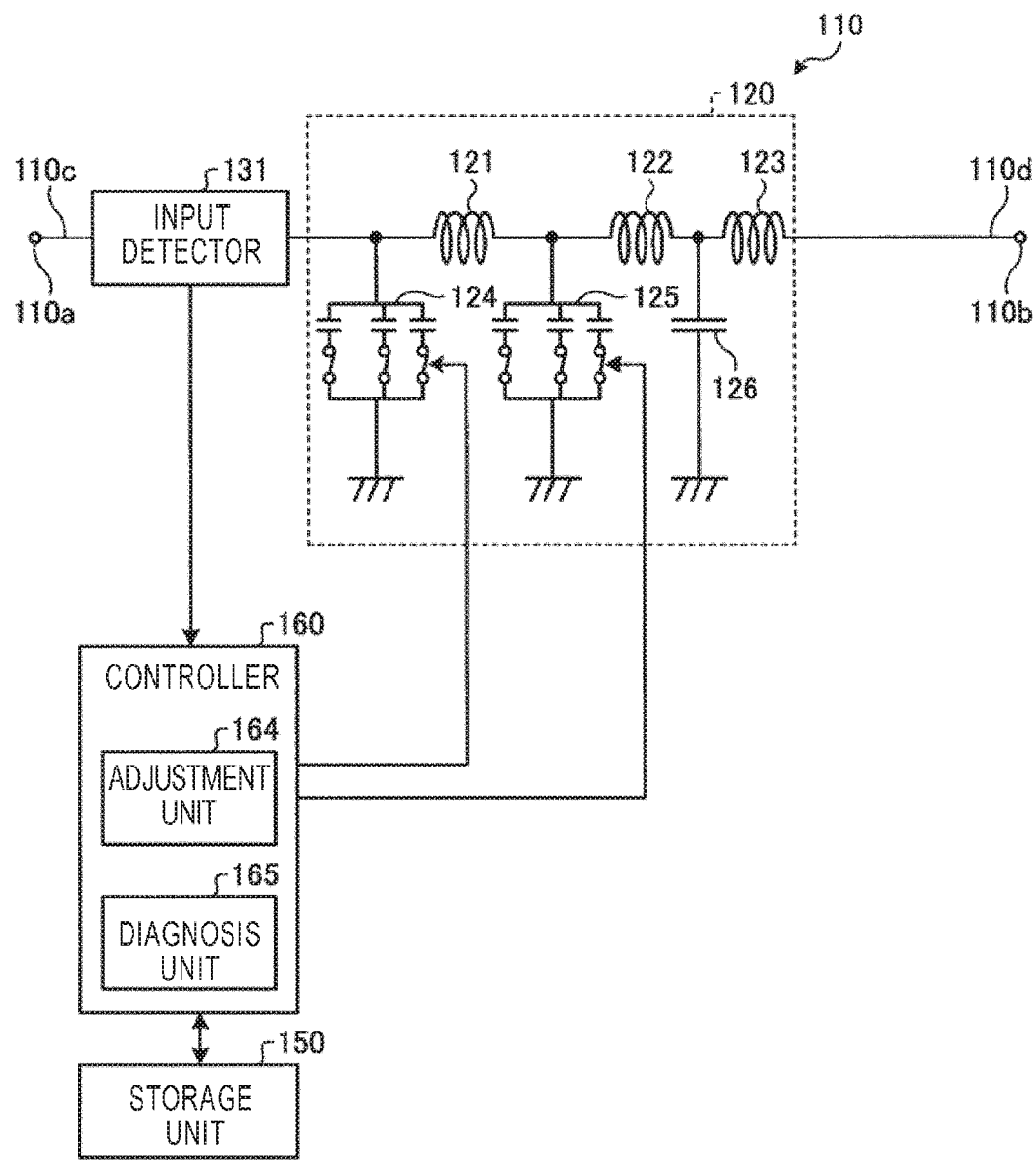
FIG. 6 is a view illustrating an example of the configuration of an impedance matching device according to a third embodiment.

FIG. 6 is a view illustrating an example of the configuration of the impedance matching device 110 according to the third embodiment. The impedance matching device 110 according to the third embodiment has substantially the same configuration as the impedance matching device 110 according to the first embodiment illustrated in FIG. 2. Thus, the same portions are denoted by the same reference numerals, descriptions thereof will be omitted, and different portions will be mainly described. The structure of the impedance matching device 110 illustrated in FIG. 6 may be applied to, for example, the matching unit 60 included in the plasma processing device 1 of the underlying technology illustrated in FIG. 1.

The impedance matching device 110 illustrated in FIG. 6 includes an input detector 131, an adjustment unit 164, and a diagnosis unit 165 instead of the input detector 130, the adjustment unit 161, and the diagnosis unit 162 illustrated in FIG. 2. Further, in the impedance matching device 110 illustrated in FIG. 6, the output detector 140 and the loss information 151 illustrated in FIG. 2 are omitted.

The input detector 131 is arranged on the wiring 110c and detects an "index value" that determines impedance matching between the radio-frequency power supply and the load. Specifically, the input detector 131 detects a phase difference between a voltage and a current of the input radio-frequency as the index value. The input detector 131 is an example of a detector.

The adjustment unit 164 adjusts the capacitance values of the variable capacitors 124 and 125 in a stepwise manner so that the phase difference detected by the input detector 131 falls within a target range indicating completion of impedance matching. Specifically, the adjustment unit 164 repeatedly adjusts the capacitance values of the variable capacitors 124 and 125 by an adjustment amount according to the phase difference until the phase difference detected by the input detector 131 falls within the target range. Then, when the phase difference detected by the input detector 131 falls within the target range, the adjustment unit 164 determines that impedance matching has been completed and ends adjusting the capacitance values of the variable capacitors 124 and 125.

The diagnosis unit 165 monitors the number of times of capacity value adjustment which is the number of times the capacitance values of the variable capacitors 124 and 125 are adjusted, and diagnoses an abnormality of the variable capacitors 124 and 125 or the input detector 131 based on the number of times of capacity value adjustment and the phase difference detected by the input detector 131. Hereinafter, the variable capacitors 124 and 125, or the input detector 131 are appropriately described as "variable capacitors 124 and 125." Specifically, when the number of times of capacitance value adjustment reaches a predetermined number and the phase difference detected by the input detector 131 does not fall within the target range indicating a completion of the impedance matching, the diagnosis unit 165 determines that an abnormality has occurred in the variable capacitors 124 and 125.

As a result, the impedance matching device 110 may determine the occurrence of an abnormality using the number of times the adjustment of the capacitance values of the variable capacitors 124 and 125 is repeated (i.e., the number of times of capacity value adjustment) and perform a self-diagnosis of an abnormality of each component constituting the impedance matching device 110.

Processing Operation of Impedance Matching Device

Figure 7:
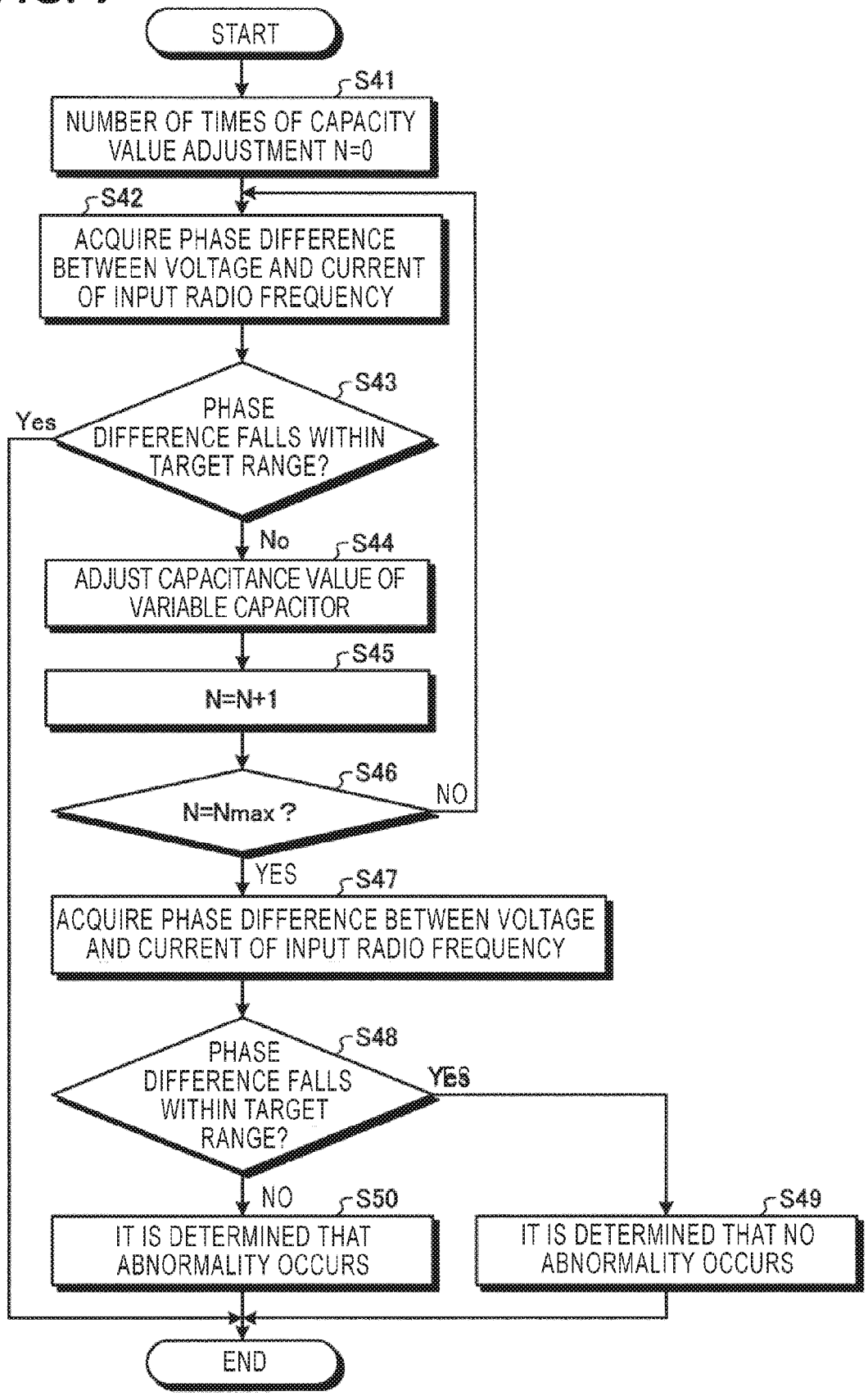
FIG. 7 is a flowchart illustrating an example of a processing operation of the impedance matching device according to the third embodiment.

Next, the configuration of the impedance matching device 110 according to a third embodiment will be described. FIG. 7 is a flowchart illustrating an example of a processing operation of the impedance matching device 110 according to the third embodiment. When the impedance matching device 110 is applied to the matching unit 60 included in the plasma processing device 1 of the underlying technology illustrated in FIG. 1, the processing operation illustrated in FIG. 7 is executed, for example, at a timing when the plasma processing on the wafer W is started in the plasma processing apparatus 1.

As illustrated in FIG. 7, a variable N for counting the number of times the capacitance values of the variable capacitors 124 and 125 have been adjusted (i.e., the number of times the capacitance value has been adjusted) is initialized to 0 (step S41). The adjustment unit 164 acquires a phase difference between the voltage and the current of the input radio-frequency detected by the input detector 131 (step S42).

The adjustment unit 164 determines whether the acquired phase difference falls within a target range indicating the completion of the impedance matching (step S43). When it is determined that the acquired phase difference falls within the target range ("Yes" in step S43), the adjustment unit 164 ends adjusting the capacitance values of the variable capacitors 124 and 125.

When it is determined that the acquired phase difference does not fall within the target range ("No" in step S43), the adjustment unit 164 adjusts the capacitance values of the variable capacitors 124 and 125 by an adjustment amount corresponding to the phase difference (step S44), and increases the number of times of capacity value adjustment N by 1 (step S45).

The diagnosis unit 165 determines whether the number of times of capacitance value adjustment N has reached a predetermined number of times $N_{max}$ (step S46). When it is determined that the number of times of capacitance value adjustment N has not reached the predetermined number of times $N_{max}$ ("No" in step in S46), the diagnosis unit 165 returns the process to step S42 and continues the adjustment of the capacitance values of the variable capacitors 124 and 125 by the adjustment unit 164. Thus, the capacitance values of the variable capacitors 124 and 125 are repeatedly adjusted until the phase difference falls within the target range.

When it is determined that the number of times of capacitance value adjustment N has reached the predetermined number of times $N_{max}$ ("Yes" in step in S46), the diagnosis unit 165 acquires a phase difference between the voltage and the current of the input radio-frequency, which is detected by the input detector 131 (step S47).

The diagnosis unit 165 determines whether the acquired phase difference falls within a target range indicating the completion of the impedance matching (step S48). When it is determined that the acquired phase difference falls within the target range ("Yes" in step S48), the diagnosis unit 165 determines that no abnormality has occurred in the variable capacitors 124 and 125 (step S49). When it is determined that the acquired phase difference does not fall within the target range ("No" in step S48), the diagnosis unit 165 determines that no abnormality has occurred in the variable capacitors 124 and 125 (step S50).

After diagnosing the abnormality of the variable capacitors 124 and 125, the diagnosis unit 165 may output a diagnosis result indicating whether the abnormality of the variable capacitors 124 and 125 has occurred to a predetermined output unit. The diagnosis unit 165 may also perform an alert when it is determined that an abnormality has occurred in the variable capacitors 124 and 125. Any method may be used for the alert when the alert may be reported to an administrator of the impedance matching device 110. Further, when it is determined that an abnormality has occurred in the variable capacitors 124 and 125, the diagnosis unit 165 may stop the radio-frequency power supply and cut off the input radio-frequency.

As described above, the impedance matching device 110 according to the third embodiment includes the variable capacitors 124 and 125, the input detector 131, the adjustment unit 164, and the diagnosis unit 165. The variable capacitors 124 and 125 are connected between a radio-frequency power supply (e.g., the radio-frequency power supply 58) and a load (e.g., the chamber 12). The input detector 131 detects an index value that determines impedance matching between the radio-frequency power supply and the load. The adjustment unit 164 adjusts the capacitance values of the variable capacitors 124 and 125 in a stepwise manner so that the detected index value falls within a target range indicating completion of impedance matching. The diagnosis unit 165 monitors the number of times of capacity value adjustment which is the number of times the capacitance values of the variable capacitors 124 and 125 are adjusted, and diagnoses an abnormality of the variable capacitors 124 and 125 or the input detector 131 based on the number of times of capacity value adjustment and the detected index value. Thus, the impedance matching device 110 may perform a self-diagnosis of an abnormality of each of the components that constitute the impedance matching device 110 (e.g., the variable capacitors 124 and 125, or the input detector 131).

Further, in the impedance matching device 110 according to the third embodiment, the input detector 131 detects a phase difference between a voltage and a current of the radio-frequency input from the radio-frequency power supply as an index value. The adjustment unit 164 adjusts the capacitance values of the variable capacitors 124 and 125 in a stepwise manner so that the phase difference detected by the input detector 131 falls within the target range. The diagnosis unit 165 determines that an abnormality has occurred when the number of times of capacity value adjustment has reached a predetermined number and the phase difference detected by the input detector 131 does not fall within the target range. As a result, the impedance matching device 110 may determine the occurrence of an abnormality with high accuracy by using the number of times the adjustment of the capacitance values of the variable capacitors 124 and 125 is repeated (i.e., the number of times of capacitance value adjustment).

For example, in each of the above embodiments, descriptions have been made on a case where the structure of the impedance matching device 110 is applied to the matching unit of the microwave plasma processing apparatus. However, the impedance matching device 110 may be applied to a matching unit of another plasma processing device. Examples of another plasma processing apparatus include a plasma processing apparatus using capacitively coupled plasma (CCP), inductively coupled plasma (ICP), electron cyclotron resonance plasma (ECR), and helicon wave plasma (HWP).

According to the present disclosure, it is possible to perform a self-diagnosis of an abnormality of each of the components which constitute the impedance matching device.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An impedance matching device comprising:
  a variable capacitor connected between a radio-frequency power supply and a load;
  a first detector configured to detect an index value that determines an impedance matching between the radio-frequency power supply and the load, and a first state value that indicates a state of a radio-frequency power input from the radio-frequency power supply;

a second detector configured to detect a second state value that indicates a state of a radio-frequency power output to the load;

adjustment circuitry configured to adjust a capacitance value of the variable capacitor in a stepwise manner such that the index value detected by the first detector falls within a target range indicating completion of the impedance matching; and diagnosis circuitry configured to diagnose an abnormality of the variable capacitor, the first detector, or the second detector based on the capacitance value adjusted by the adjustment circuitry, the first state value detected by the first detector, and the second state value detected by the second detector, wherein the first detector detects a phase difference between a voltage and a current of the radio-frequency power input from the radio-frequency power supply as the index value, and detects a power value of the radio-frequency power input from the radio-frequency power supply as the first state value, the second detector detects a power value of the radio-frequency power output to the load as the second state value, the adjustment circuitry adjusts the capacitance value of the variable capacitor in a stepwise manner such that the phase difference detected by the first detector falls within the target range, and the diagnosis circuitry calculates a theoretical value of the power value of the radio-frequency power output to the load based on the capacitance value adjusted by the adjustment circuitry and the power value detected by the first detector, and determines that the abnormality has occurred when a difference between the calculated theoretical value of the power value and the power value detected by the second detector is equal to or greater than a predetermined threshold.

2. An impedance matching device comprising:

a variable capacitor connected between a radio-frequency power supply and a load;

a first detector configured to detect an index value that determines an impedance matching between the radio-frequency power supply and the load, and a first state value that indicates a state of a radio-frequency power input from the radio-frequency power supply;

a second detector configured to detect a second state value that indicates a state of a radio-frequency power output to the load;

adjustment circuitry configured to adjust a capacitance value of the variable capacitor in a stepwise manner such that the index value detected by the first detector falls within a target range indicating completion of the impedance matching; and diagnosis circuitry configured to diagnose an abnormality of the variable capacitor, the first detector, or the second detector based on the capacitance value adjusted by the adjustment circuitry, the first state value detected by the first detector, and the second state value detected by the second detector, wherein the first detector detects a phase difference between a voltage and a current of the radio-frequency power input from the radio-frequency power supply as the index value, and detects a power value of the radio-frequency power input from the radio-frequency power supply as the first state value, the second detector detects an amplitude value of the radio-frequency power ($V_{pp}$ value) output to the load and an impedance value on a side of the load as the second state value, the adjustment circuitry adjusts the capacitance value of the variable capacitor in a stepwise manner such that the phase difference detected by the first detector falls within the target range, and the diagnosis circuitry calculates a theoretical value of the $V_{pp}$ value based on the capacitance value of the variable capacitor adjusted by the adjustment circuitry, the power value detected by the first detector, and the impedance value on the side of the load detected by the second detector, and determines that the abnormality has occurred when a difference between the calculated theoretical value of the $V_{pp}$ value and the $V_{pp}$ value detected by the second detector is equal to or greater than a predetermined threshold.

3. An impedance matching device comprising:

a variable capacitor connected between a radio-frequency power supply and a load;

a detector configured to detect an index value that determines an impedance matching between the radio-frequency power supply and the load;

adjustment circuitry configured to adjust a capacitance value of the variable capacitor in a stepwise manner such that the index value detected by the detector falls within a target range indicating completion of the impedance matching; and diagnosis circuitry configured to monitor a number of times of capacitance value adjustment which is a number of times a capacitance value of the variable capacitor has been adjusted by the adjustment circuitry, and diagnose an abnormality of the variable capacitor or the detector based on the number of times of capacitance value adjustment and the index value detected by the detector, wherein the detector detects a phase difference between a voltage and a current of the radio-frequency power input from the radio-frequency power supply as the index value, the adjustment circuitry adjusts the capacitance value of the variable capacitor in a stepwise manner such that the phase difference detected by the detector falls within the target value, and the diagnosis circuitry determines that the abnormality has occurred when the number of times of capacitance value adjustment reaches a predetermined number of times and the phase difference detected by the detector does not fall within the target value.

\* \* \* \* \*